United States Patent [19]

Romano et al.

[11] Patent Number: 4,479,198
[45] Date of Patent: Oct. 23, 1984

[54] MODULAR COMPUTER SYSTEM

[75] Inventors: Domenic R. Romano, Chelmsford; Hans H. Henneberg, Canton; James W. Pratt, Kingston; Maurice A. Coppelman, Framingham, all of Mass.

[73] Assignee: Honeywell Information Systems Inc., Waltham, Mass.

[21] Appl. No.: 468,916

[22] Filed: Feb. 23, 1983

[51] Int. Cl.³ .............................................. H05K 5/00
[52] U.S. Cl. ..................................... 364/900; 364/708
[58] Field of Search .............................. 364/200, 900

[56] References Cited

U.S. PATENT DOCUMENTS 4,388,671  6/1983  Hall et al. ........................... 361/383

OTHER PUBLICATIONS

A Consumer's Guide to Personal Computers and Microcomputers, Chapter 8–by Freiberger and Chew published by Hayden 1978.
A Buyer's & Builder's Guide to the Heathkit H8 System by Richard Arnold, Interface Age, Jun. 1978.

Primary Examiner—Thomas M. Heckler
Assistant Examiner—John G. Mills
Attorney, Agent, or Firm—Faith F. Driscoll; Nicholas Prasinos

[57] ABSTRACT

Each electronically operated customer installable/replaceable unit module of a computer system is separately packaged to totally enclose the electronic/mechanical parts of each module within a box-like container or wrapper, the structure designed to maximize air flow through the system. This includes an electronics base module containing the basic logic circuits for the system, a power module containing all of the systems power supply circuits, and a pair of storage modules each containing the electronics and mechanical parts of a diskette device. The modules are loosely inserted into comparably shaped opened compartments of an enclosure base and bezel assembly constructed for toolless installation and removal of modules. An enclosure top cover which fits into the bezel contains finger-like protrusions in addition to embossing. When latched to the base and bezel assembly, the top cover correctly positions and holds the modules in place.

49 Claims, 11 Drawing Figures

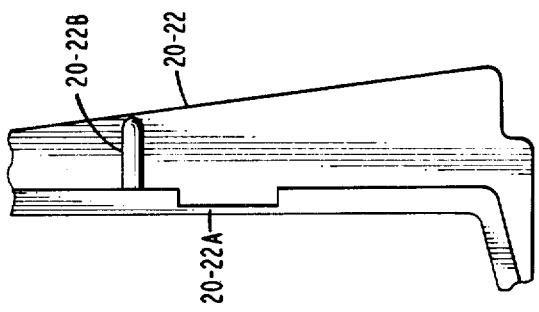
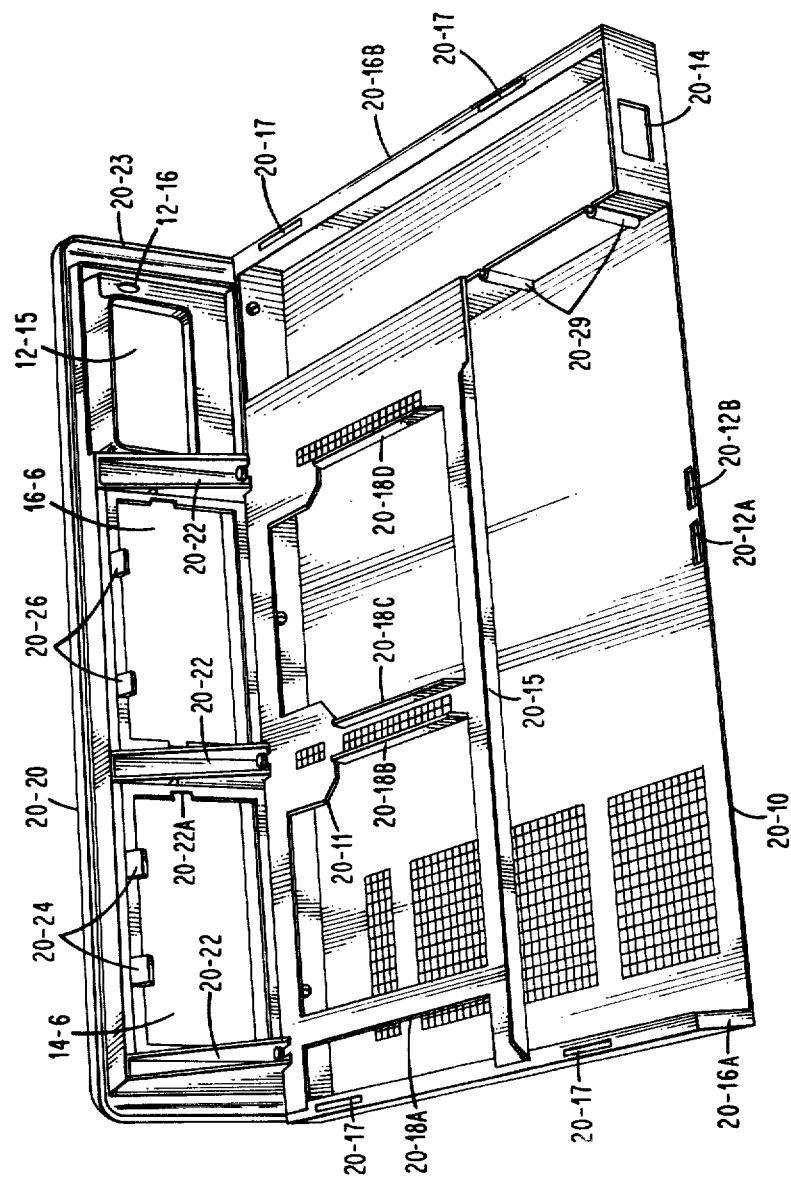

Fig. I.

MODULAR COMPUTER SYSTEM

BACKGROUND OF THE INVENTION

1. Field of Use

This invention relates to computer systems and more particularly to the assembly of several modules into a complete computer system.

2. Prior Art

With the advent of personal computers, manufacturers have sought to place more emphasis on making their computers more compact, more accessible and more serviceable by non-technical users. In making a system more serviceable, it becomes necessary to expose a user to the internal electronic circuits of the system. Accordingly, it has become necessary to provide each user with elaborate instructions together with tools to allow assembly and disassembly of the different electronic modules within the system.

Because of the compact nature of such systems, electronic modules are crowded together and their cable interconnections are made difficult to disconnect. This increases the likelihood of a user in attempting to install or replace modules changing or altering the modules operation. Also, it may be possible to connect the modules in an incorrect manner, rendering the system inoperative as well as causing damage to the modules. Thus, it becomes necessary to provide non-technical users with assembled systems or provide technical assistance in the assembly process.

By confining the modules within a limited space gives rise to problems of cooling. These problems are further complicated by desires to reduce ambient noise and the level of expelled air.

Additionally, through system operation, the electronic modules can build up static charges which when discharged can damage a module as well as exposing the user to a potential static shock.

Accordingly, it is a primary object of the present invention to provide a modular computer system including a number of customer installable/replaceable units which can be easily assembled into a system without error by a non-technical user.

It is a further object of the present invention to provide a modular computer system whose modules can be easily connected and disconnected without causing damage to any module or adversely affecting system operation.

SUMMARY OF THE INVENTION

The above and other objects of the present invention are achieved in the preferred embodiment of a computer system which includes a number of fully enclosed modules or customer installable/replaceable units. The modules are loosely placed within open compartments within an enclosure base and bezel assembly. They are correctly positioned and held firmly by a top cover which is placed over the top of the modules and latched to the enclosure base.

According to the teachings of the present invention, each module is separately packaged so that the electronic circuits and/or device are housed within a container or wrapper shaped in conformity with the physical configuration/arrangement of printed boards and/or mechanical parts being enclosed. All cables and connectors are kept to a minimum and connected inside the enclosure. The external cables pass through a common opening in the enclosure to the outside. Thus, all connectors which connect to the external cables are contained within the confines of the enclosure. The lengths of cables which interconnect modules and connector shapes are selected so that only the correct connectors can be plugged into the correct receptacles.

In the preferred embodiment, the modules include an electronics base logic module which houses the basic logic circuits for the computer system, a power module which contains all of the systems power supply components which include a single fan positioned near the front of the power module, and a pair of storage modules, each housing the electronics and mechanical components of a diskette device. According to the present invention, the basic logic module slides into a bottom compartment of the enclosure base from the back and the remaining modules are placed in the comparable shaped open compartments within the enclosure base located adjacent to or above the basic logic module.

The inside of the enclosure cover is embossed to include a pair of finger-like protrusions, in addition to stiffening rib members. When the cover is placed over the top of the modules and being attached to the enclosure base, the cover protrusions and rib members apply forces in the appropriate directions for correctly positioning the modules and thereafter holding them in place.

According to the teachings of the present invention, certain surfaces of the module containers or wrappers, as well as certain portions of the enclosure base, are perforated or slotted to provide a predetermined pattern of air flow for module cooling. To establish such predetermined air flow pattern, the power module is positioned in an open compartment located adjacent one side of the enclosure base. The single system fan is mounted on the inner side wall of the power module wrapper. Additionally, the enclosure base side opposite the fan contains a number of equally spaced slots. These slots are used to control both the entry location and amount of air introduced into the system. The patterns of perforations, in addition to the size and spacing between compartment openings, are selected to maximize cooling. The wrapper material and pattern dimensions are selected to minimize unwanted radio frequency and electromagnetic interference by the electronic circuits within the modules.

During system operation, the predetermined air flow pattern is established by the fan pulling air in from the enclosure base slots located on one side of the enclosure and across the module surfaces into the power module on the opposite side of the enclosure. The fan then pushes the air over the power module components and exhausts the air out the rear of the power module through slots in the enclosure top cover.

The cooling arrangement of the invention maintains the acoustic levels as low as possible due to the baffle action by the power module components. That is, the power module components break up the air flow pattern without obstruction so that only a gentle flow of air can be felt outside the enclosure at the exit point. Because of increased cooling efficiency, it is possible to reduce the fan speed requirements thereby further reducing acoustic levels as well as adding to user comfort.

The modular and connectability characteristics of the system have the primary advantage of permitting an unskilled user to correctly assemble the modules without the possibility of damage to the system. This permits ease of shipment to users and eliminates the necessity of having to preassemble each computer system. However, even if preassembly is desired, it can be carried out more expeditiously and at less cost.

The novel features which are believed to be characteristic of the invention, both as to its organization and method of operation, together with further objects and advantages, will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIGS. 2a and 2b show in greater detail the base and bezel assembly of enclosure 20 of FIG. 1.

DESCRIPTION OF THE PREFERRED EMBODIMENT

Figure 1:
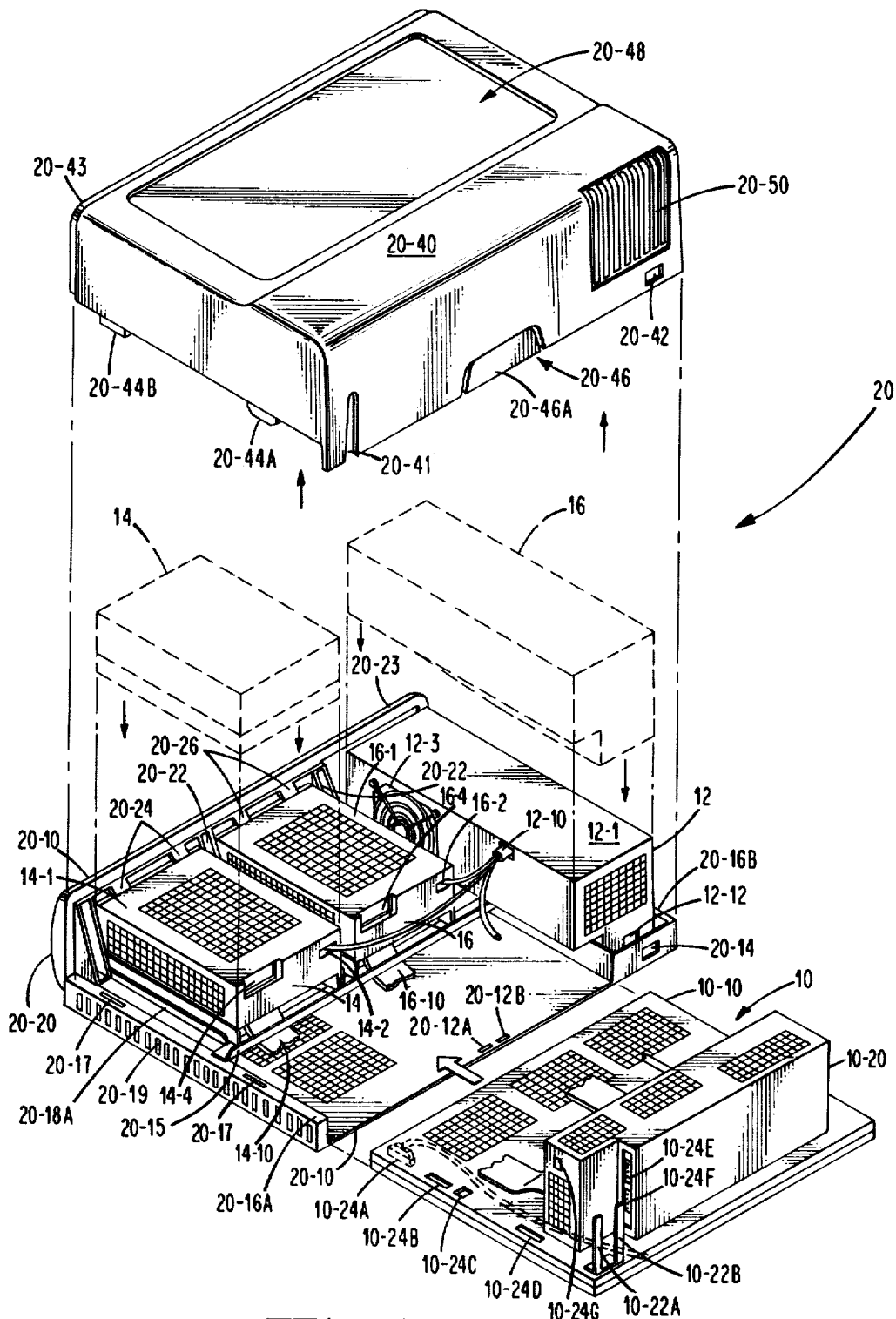
FIG. 1 is an isometric drawing of the modules which comprise the computer system of the preferred embodiment of the present invention.

FIG. 1 is an isometric drawing illustrating all of the modules which comprise the computer system of the present invention. As shown in FIG. 1, the system is constructed from a number of customer installable/replaceable units (CRUs). These include a slidable electronics base logic board module 10, a power supply module 12 and a pair of storage modules 14 and 16, in addition to an enclosure 20. The modules are loosely positioned within cut out sections or open compartments of a base 20-10 of a two-section base and bezel assembly of enclosure 20. Those modules viewable from the front of the system are framed by openings within a bezel 20-20. The enclosure assembly 20 also includes a top cover 20-40 which fits over the base 20-10 and fits under the rear of a raised lip or rim 20-13 which runs along the top and sides of bezel 20-20.

A latch assembly 20-46 is used to attach top cover 20-40 to the enclosure base 20-10. A portion of the latch assembly 20-46 when cover 20-40 is properly aligned passes through a pair of rectangular slots 20-12A and 20-12B located at the rear of the bottom of base 20-10 of the assembly as shown.

As seen from FIG. 1, the bezel 20-20 includes several rib sections 20-22 positioned between the storage modules 14 and 16 which attach to base 20-10. The rib sections are tapered to increase the rigidity of the bezel 20-20. Also, bezel 20-20 includes two sets of angled tabs 20-24 and 20-26. The tabs 20-24 vertically position or restrain module 14. That is, they prevent module 14 from lifting vertically during system operation. The tabs 20-26 perform the same function for module 16.

Figure 7:
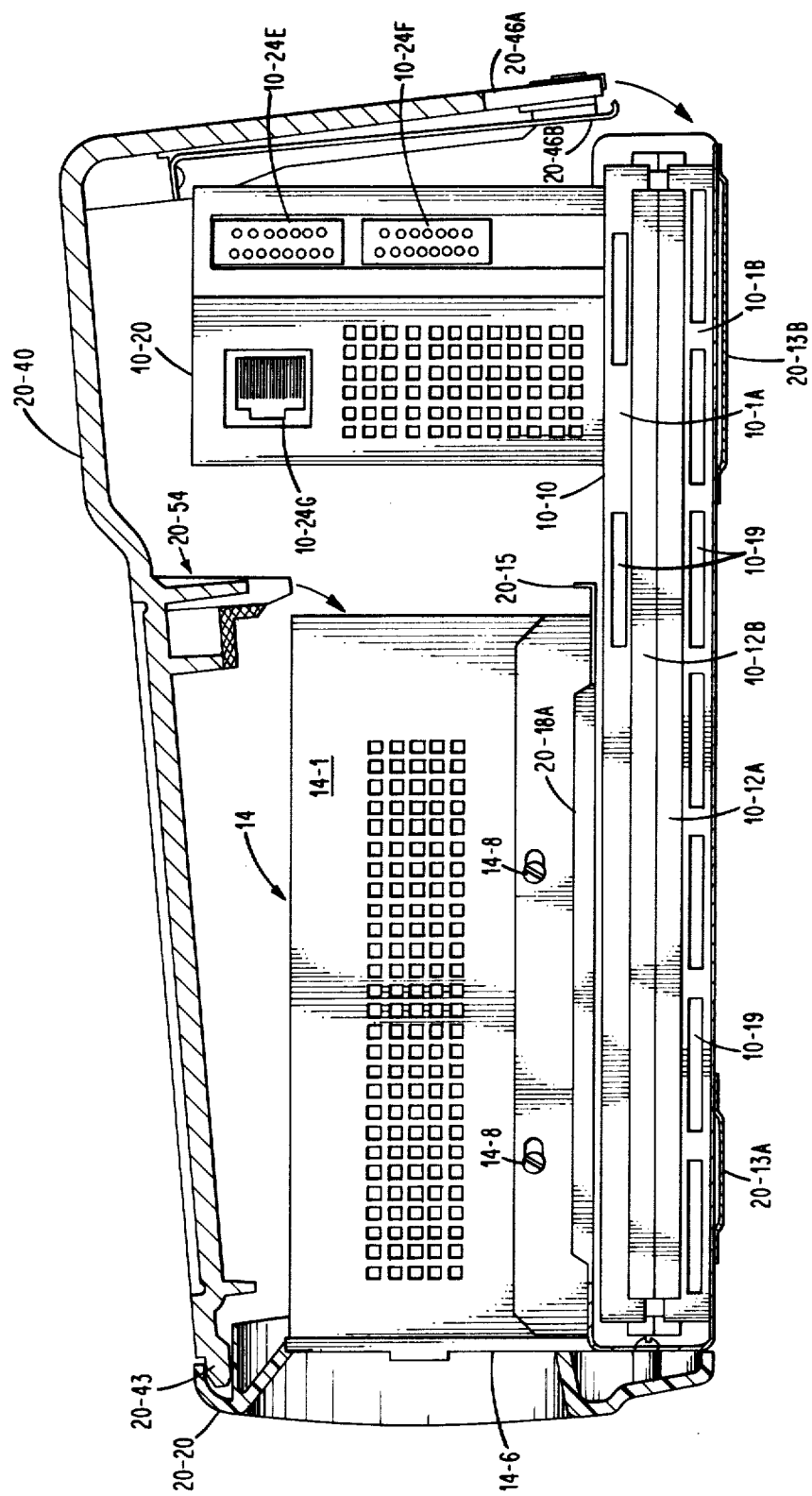
FIG. 7 is used in explaining the assembly of the computer system of FIG. 1.

As mentioned, the top 20-11 of the enclosure base 20-10 includes a number of cut out sections into which the modules are placed. The cut out sections for modules 14 and 16 have flanges on the sides such as 20-18 which function as both a guide and as a restraint. That is, the flanges on the sides position storage modules 14 and 16 horizontally and guide them as they are being pushed toward the front or bezel 20-20 during assembly. Additionally, the top of the base 20-10 includes a horizontal member 20-15. Member 20-15, in addition to providing structural support for storage modules 14 and 16, acts as a stop preventing the storage modules from being mispositioned so that they can be properly locked in place by top cover 20-40. The bottom of enclosure base 20-10 is elevated slightly by a pair of channels which extend laterally across the bottom. The channels 20-13A and 20-13B are shaped as shown in FIG. 7.

The top of both sides 20-16A and 20-16B of enclosure 20 include a pair of rectangular slots 20-17, which are used to position top cover 20-40. The left side 20-16A of enclosure 20 includes a number of equally spaced vertical rectangular slots 20-19. In accordance with the present invention, the 20-19 slots are used to control the amount and the point at which air enters the system.

The front part of the top cover housing 20-40 is recessed and molded to form frame 20-43. The frame 20-43 fits underneath the raised lip 20-23 of bezel 20-20. The frame 20-43 is wide enough to form a step or space between the top cover 20-40 and bezel 20-20 for ease of positioning.

As shown, the top of top cover 20-40 is recessed to provide a platform area 20-48 for mounting a cathode ray tube (CRT) display monitor device. A pair of tabs 20-44A and 20-44B are molded on each side of top cover 20-40. These tabs are inserted into the pairs of slots 20-17 of enclosure base 20-10 thereby properly aligning the top cover 20-40, as well as holding it in place. More particularly, tab 20-44A acts to position the cover 20-40 and move the modules in place. Tab 20-44B holds the cover in the correct horizontal position in relation to enclosure base 20-10.

A vertical slot 20-41 in the rear of cover 20-40 provides a common exit point for the cables passing through the cable guide posts 10-22A and 10-22B. The rectangular cut out section 20-42 in the rear of top cover 20-40 is an AC cable connector port. It requires that AC power cable be disconnected before the top cover 20-40 can be removed for user safety. The vertical slots 20-50 above section 20-42, which extend over a portion of the top of cover 20-40, provide an exit for exhausting air.

The rear of cover 20-40 further includes latch assembly 20-46. The assembly 20-46 inhibits the vertical movement of the system modules. The assembly 20-46 has a handle 20-46A and a latch spring 20-46B (not shown) which locks the top cover 20-40 down onto enclosure base 20-10 by means of slots 20-12A and 20-12B, while at the same time holding all of the modules in position.

Each of the modules containing mechanical and/or electronic parts, circuit boards, etc. is housed in a metal container or wrapper shaped to conform to the particular configuration of circuit board and/or mechanical parts making up the module. This permits safe and ease of handling and installation by non-technical users, since all internal parts and circuits are fully protected against any damage.

The electronic circuits and circuit boards of base logic board module 10 are housed in a two-piece wrapper 10-1 which corresponds to sections 10-1A and 10-1B. The top section 10-1A of the wrapper has a horizontal portion 10-10 which supports a rectangular box shaped top portion 10-20. The top portion 10-20 is cut away to provide space for connector receptacles 10-24E and 10-24F which connect to communications cables. The electronics base logic board module container or wrapper 10-1 is shaped to house a horizontal printed circuit board and several smaller option printed circuit boards.

Figure 4:
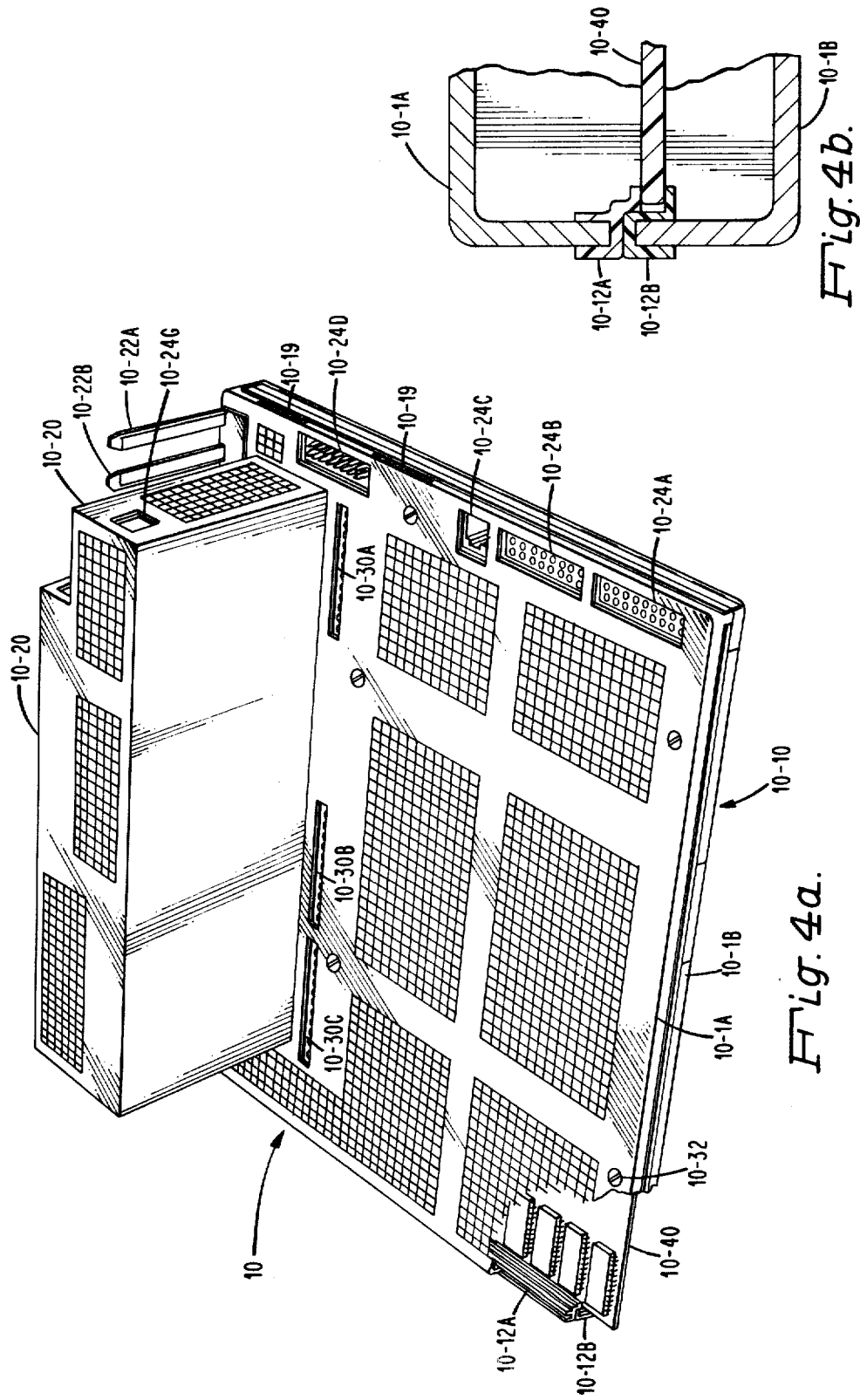
FIGS. 4a and 4b show in greater detail, the base electronics module of FIG. 1.

The horizontal printed circuit board contains the circuit components for the systems central processing unit, and input/output microprocessor and the control units whose external interfaces or ports connect through cables to receptacles 10-24A through 10-24D mounted on the side of the board which are accessible through openings in horizontal base portion 10-10. Additional cables plug into the horizontal printed circuit board receptacles 10-30A, 10-30B and 10-30C shown in FIG. 4a located in front of top portion 10-20 which are accessible through openings in horizontal portion 10-10 of section 10-1A. The other ends of these cables plug into receptacles located in modules 16 and 14 and to a power cable from power supply module 12.

The top portion 10-20 of section 10-1A houses several option vertically positioned circuit boards which plug into receptacles or sockets mounted on the horizontal printed circuit board. The option boards include the circuit components for system expansion.

A pair of posts 10-22A and 10-22B which form a cable guide are positioned at the far corner of base 10-10. That is, all of the external cables which connect to the different connectors 10-24A through 10-24F mounted on the base and top portion 10-10 and 10-20 pass between posts 10-22A and 10-22B and exit through the same vertical slit 20-41 in cover 20-40. Except for the power module cable, all of the cables are concentrated in one area facilitating user system assembly and disassembly.

The power module 12 is housed in the rectangular box shaped container or wrapper 12-1. The container 12-1 fits into a rectangular shaped open compartment or section of base 20-10. As explained herein, power module 12 is so oriented to provide cooling according to the present invention.

The module wrapper 12-1 houses the printed circuit board(s) which contain the power supply components, a circuit breaker, power switches and a centrally located cooling fan. As seen from FIG. 1, the centrally located fan is mounted on the inner side of wrapper 12-1 so that it pulls air into opening 12-3. The power supply module receives AC power through a power cable which passes through matching square slots 20-42, 20-14 and 12-12 contained in top cover 20-40, base 20-10 and power supply wrapper 12-12.

A cable harness 12-10 distributes power from module 12 to modules 14 and 16 through cables which plug into receptacles located within the modules 14 and 16 accessible through openings or ports 14-2 and 16-2 respectively. A third cable plugs into a connector receptacle 10-30C located on the horizontal base 10-10 of module.

As shown in FIG. 1, power module wrapper 12-1 is perforated at the rear to exhaust air out of the system for proper cooling.

Each of the storage modules 14 and 16 are placed on the top 20-11 of base 20-10 above module 10 over one of the cut out sections or compartments over one of the the enclosure base 20-10. The storage modules are housed within wrappers 14-1 and 16-1, respectively. Each storage module contains the electronic and mechanical components parts for one 5¼" diskette drive device.

Enclosure Base and Bezel 20-10 and 20-20

FIGS. 2a and 2b show in greater detail, the base and bezel 20-10 and 20-20 of enclosure assembly 20 of FIG. 1. The base 20-10 is constructed from metal material and bezel 20-20 is molded from plastic material. The same reference numbers used to designate elements in FIG. 1 are used to designate the same elements in FIGS. 2a and 2b as well as the remaining Figures.

From FIG. 2a, it is seen that the bezel 20-20 and base 20-10 are fastened together from the top and front by screws as shown. That is, there is a screw fastener at each of the rib sections 20-22 and three screws positioned along the inside front part of the base 20-10. FIG. 2a shows the three openings in bezel 20-20 for framing and retaining modules 14, 16 and 12 in place. Also, the Figure shows in greater detail, raised top 20-13 which runs along the inside edge of bezel 20-20.

As previously mentioned, the first two flanges 20-18a and 20-18b on the top of base 20-10 guide and restrain storage module 14. The next two flanges 20-18c and 20-18d guide and restrain storage module 16. Both modules are also supported as well as being restrained front to back by horizontal member 20-15. The cut out sections on the top of base 20-10 have been narrowed in the front, as shown, to give additional structural support for storage modules 14 and 16.

The rectangular cut out section provided for power module 12 has two protuberances 20-29 on the inside wall of the section which provide a separation distance between the power supply module 12 and electronics base logic board module 10. This permits an additional flow of air up from the bottom of module 10 enhancing cooling. Additionally, portions of the top and bottom of the base 20-10 are perforated as shown for cooling as discussed herein.

FIG. 2b shows in greater detail, one of the rib sections 20-22. As seen from the Figure, the front part of each rib section has a notch or cut out portion 20-22A for properly framing and restraining the storage module. Additionally, each side of the rib section has a horizontal dimpled or raised portion 20-22B positioned above cut out portion 20-22A. The thickness and shape of portion 20-22B is so selected to provide a secure fit for the storage module it frames.

Enclosure Top Cover 20-40

Figure 3:
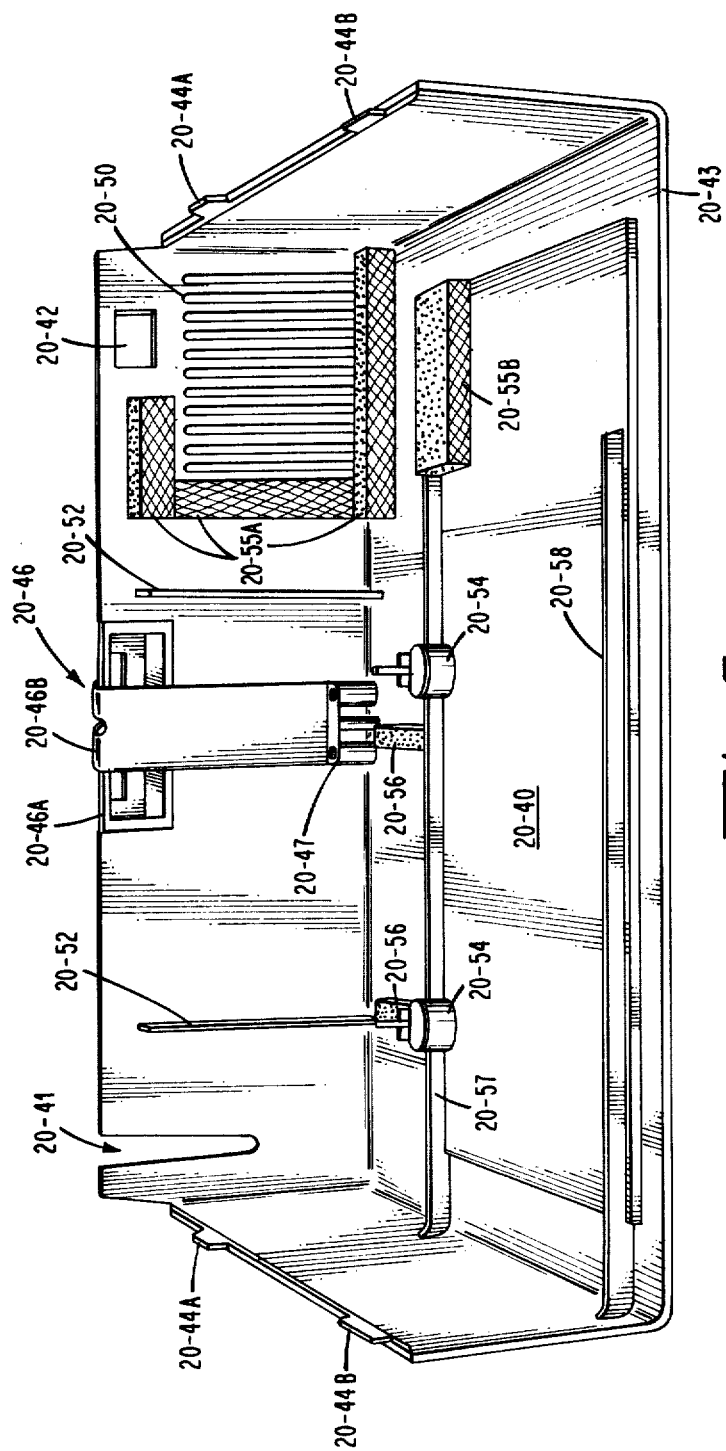
FIG. 3 shows in greater detail, the top cover of enclosure 20 of FIG. 1.

FIG. 3a shows in the inside of top cover 20-40 of enclosure assembly 20 constructed according to the present invention. The cover 20-40 is also molded from plastic material. Starting from the rear, it is seen that latch assembly 20-46 includes the latch handle 20-46A and a latch spring 20-46B which fastens to the top cover 20-40 by means of screw and associated mounts 20-47 as shown. The two sections of the latch spring 20-46 separated by a U-shaped cut out section are curled at their ends so that the cover can be locked in place on enclosure base 20-10.

On both sides of latch assembly 20-46 are ribs 20-52 which apply equal forces to the rear portion of top portion 10-20 of module 10 for correctly positioning the module within enclosure 20 during cover closing.

The inside rear part of the cover 20-40 there is an "L" shaped rubber pad 20-55A whose primary function is to close off the recirculation of exhaust air flow. Additionally, pad 20-55A holds power module 12 in place (prevents lateral motion) while a pad 20-55B located on the top inside part of cover 20-40 presses down on power module 12.

Also, on the top inside part of cover 20-40 are a pair of finger-like protrusions or "cams" 20-54. Each of the protrusions 20-54 is molded to form a substantially 90 degree angle with its rounded base portion to provide a cam like action while the cover 20-40 is being closed. That is, as the cover 20-40 is being closed, they apply forces both down and towards the front or bezel portion 20-20 which moves storage modules 14 and 15 forward and holds them in place.

Portions of the surfaces of both protrusions 20-54 are paded with rubber material to provide a cushioning or shock inhibiting effect when the top cover 20-40 is locked in place. A pair of rectangular-shaped rubber pads 20-56 are located behind protrusions 20-54. These pads hold base electronics module 10 in place. A pair of horizontal rib members 20-57 and 20-58 provide the required support for the CRT display mounting unit placed on top cover 20-40. Additionally, the end of rib member 20-58 is positioned to further position power supply module 12 in place. The inside portion of frame 20-43 is shaped as shown to fit under the rim 20-23 of bezel portion 20-20.

Electronics Base Logic Board Module 10

FIGS. 4a through 4b show in greater detail the assembly comprising module 10. As mentioned, the module container or wrapper includes top section 10-1A and bottom section 10-1B. These two sections completely enclose the horizontal printed circuit board 10-40 which contains the basic logic circuits and system support circuits in the form of integrated circuit chips mounted as shown in FIG. 4a. Sets of extruded flexible plastic strips, such as 10-12A and 10-12B, are used to interlock sections 10-10A and 10-10B and lock the printed circuit board 10-40 in place. The strips 10-12A and 10-12B of each set have flanges and are slotted so that the strips of each set fit over the mating edges of both sections as shown. When so fitted, the flanges of both strips join together to form a slot into which the printed circuit board 10-40 is locked in place as shown in FIGS. 4a and 4b. As seen from the cut away portion of FIG. 4a, printed circuit board 10-40 has a small boarder which is free of circuit chips. This allows sufficient space for mounting the strips 10-12A and 10-12B of each set. This arrangement provides an inexpensive easy way of joining together sections 10-1A and 10-1B.

The circuit board 10-40 is sandwiched together between sections 10-1A and 10-1B by five bushings which are screwed together with screws 10-32. Two of these bushings provide ground connections from the circuit board 10-40 to the wrapper 10-1 and provide a certain degree of immunity against electrostatic discharge.

As seen from FIG. 4a, cables plug into the different shaped receptacles 10-24A through 10-24F and 10-30A through 10-30C.

FIG. 4a illustrates the patterns of perforations which appear on section 10-1A and the top and sides of the top portion 10-20 of section 10-1A. The bottom section 10-1B contains a pattern similar to section 10-1B. Also, wrapper section 10-1B has a number of horizontal slots 10-19 along both sides, while section 10-1A includes a pair of slots to further enhance cooling. The patterns are selected to maximize the cooling of the printed circuit board chips on board 10-40, as well as the chips mounted on the option boards, which plug into board 10-40 and are enclosed within top portion 10-20.

Power Supply Module 12

Figure 5:
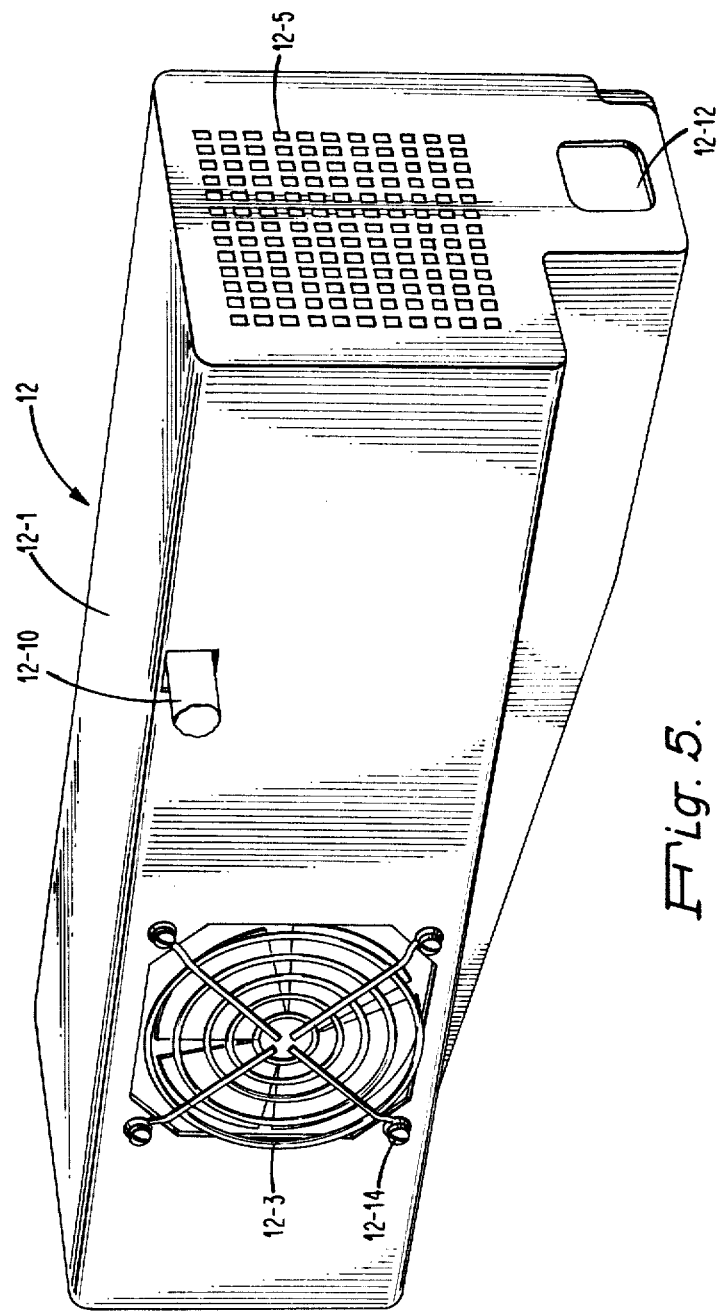
FIG. 5 shows in greater detail, the power supply module of FIG. 1.

FIG. 5 shows in greater detail the power module 12. As mentioned, the L-shaped wrapper or container 12-1 of the module conforms to the physical configuration of power supply circuit board components contained therein.

According to the present invention, the sole fan in the system is centrally located within module 12. That is, the fan attaches internally to the inner side of the power module wrapper 12-1 by means of four bushings which are fastened by screws 12-14.

Also, according to the invention, only the rear portion 12-5 of wrapper container 12-1 is perforated for gently exhausting air outside the system. The remaining portions of container 12-1 are free from perforations to prevent any recirculation of air flow.

Storage Modules 14 and 16

Figure 6:
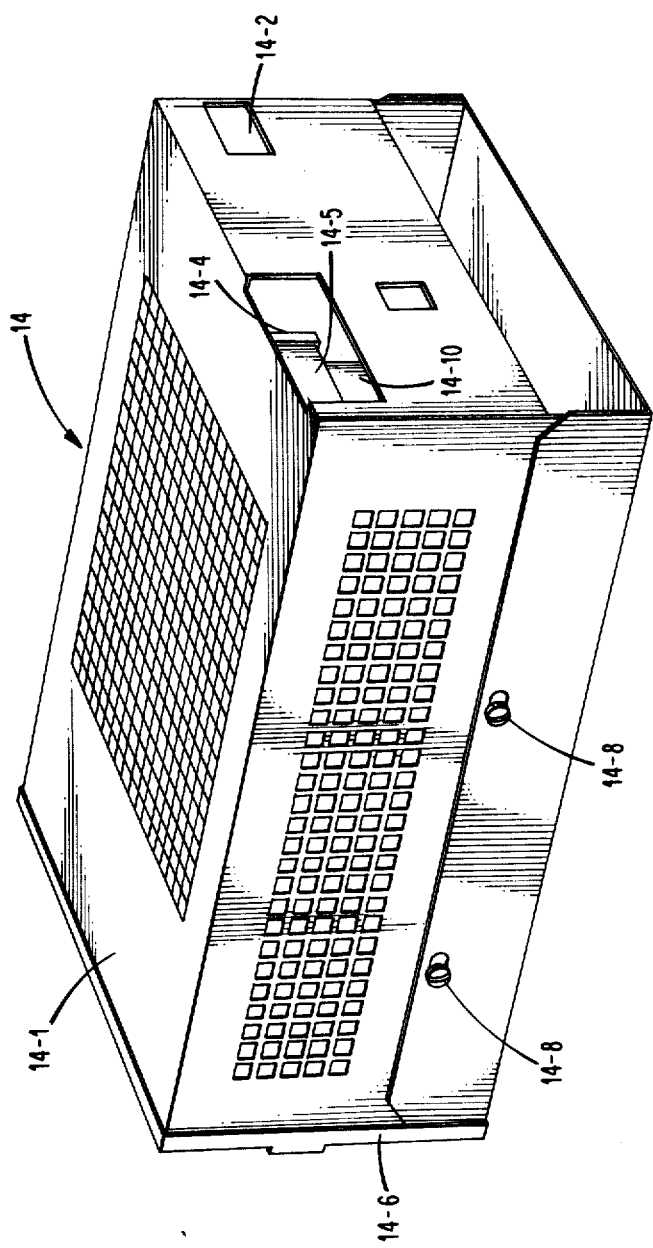
FIG. 6 shows in greater detail, one of the storage modules of FIG. 1.

FIG. 6 shows in greater detail the assembly for identical modules 14 and 16. As seen from FIG. 6a, the wrapper or container 14-1 conforms in shape to the mechanical and printed circuit board electrical components of a 5¼" diskette. The container 14-1 is constructed from two U-shaped sections which fit around and completely enclose the storage module, except for front portion 14-6. Both sections are attached by a pair of screws 14-8 on each side of the module 14.

As seen from FIG. 6, the side and top portions of wrapper 14-1 are perforated so as to maximize cooling. The same patterns of perforations are duplicated on the bottom and other side of the module 14. A ribbon cable (not shown) plugs into receptacle 14-5 and is accessible through opening 14-4.

SYSTEM ASSEMBLY

With reference to FIGS. 1 through 6 and 9, in addition to the diagram of FIG. 7, the manner of assembling the computer system of the preferred embodiment of the present invention will now be described.

It will be assumed by way of example that a non-technical user will receive modules 10, 12, 14, 16 and enclosure assembly 20 each separately packaged and placed into shipping boxes. After opening the boxes, the user places the enclosure assembly 20 on the desired work area. By pressing latch 20-46 at the rear of top cover 20-40, a user can lift the top cover 20-40 in the direction indicated by the arrows of FIG. 1, and remove it from base portion 20-10 of enclosure 20. At this point, the enclosure 20 appears as in FIG. 2a. The power cord normally taped to the enclosure base portion 20-10 is removed and set aside.

With the enclosure base 20-10 positioned as in FIG. 2a, the user places power module 12 into the rectangular cut out section of enclosure base portion 20-10 as shown by the arrows underneath module 12 in FIG. 1. It is installed so that the power supply power off-on switch 12-17 and power supply light indicator show through the small openings 12-15 and 12-16 on the left side of bezel 20-20 of FIG. 9. Also, the power supply cables are placed inside the enclosure base portion 20-10.

Next, the user positions the logic unit module 10 as shown in FIG. 1 and from the back slides the module almost all of the way into enclosure base 20-10 in the direction indicated by the arrows at the front and back of the module. With sufficient space left, the user plugs the connector at the end of the power supply cable into receptacle 10-30C.

Figure 9:
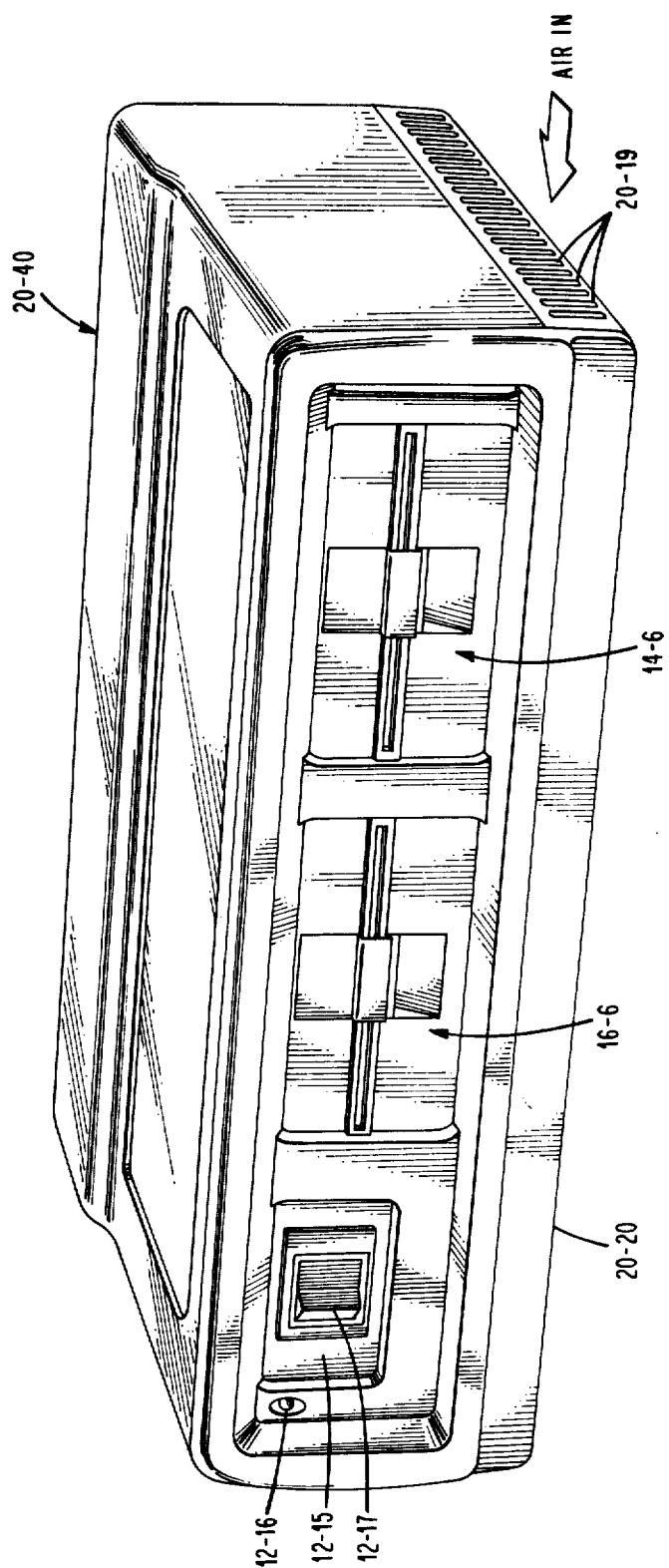
FIG. 9 shows the front portion of enclosure 20 when the computer system of FIG. 1 is completely assembled.

Next, the user can install the storage modules 14 and 16 in whatever order desired. The storage module, such as module 14, is placed from the back on the top part of the enclosure base portion 20-10 between the sets of ribs 20-18A and 20-18B as indicated by the arrows below module 14 shown in dotted form. The front end 14-6 of the module 14 is placed in the center opening or window of bezel 20-20 as shown in FIG. 9.

Next, the diskette module ribbon cable is plugged into receptacle 10-30A on the base logic module 10 as shown in FIG. 1. The next longest cable from power supply module 12 is plugged into the receptacle accessed by rectangular slot 14-2. Once both cables are connected, they are tucked down between the modules 10 and 12. The second storage module 16 is installed in an identical manner.

After completing the above, the user slides module 10 the rest of the way into the enclosure base 20-10. At this time, the modules loosely reside within the enclosure base portion 20-10. The cables, connected to the various external units, are plugged into receptacles 10-24A through 10-24F. Also, each such cable is passed between cable guide posts 10-22A and 10-22B of FIG. 1.

The modules are locked in place by the user when the top cover 20-40 is placed over base 20-10 and bezel 20-20 as shown in FIG. 7. That is, the edge or rim 20-43 of top cover 20-40 is positioned so it fits under the curved or lip of bezel 20-20. As the user moves top cover 20-40 in the direction of the arrow at the rear of the cover, each finger-like protrusion or cam 20-54 applies forces in both a downward and forward direction as indicated by the center arrow so as to correctly position one of the storage modules (e.g. module 14) within the enclosure base 20-10.

At the same time, the user causes ribs 20-52 of FIG. 3a to press module 10 in place while the rubber pads 20-55 and 20-56 of FIG. 3a press module 12 and module 10 in place. During the process of closing top cover 20-40, the user presses in latch handle 20-46A holding the spring latch 20-46B in place until it snaps into place. This allows the latch spring 20-46B to pass between slots 20-12A and 20-12B of FIG. 1, so that the curved portions of latch 20-46B engage slots 20-12A and 20-12B and are locked in place when the user releases latch handle 20-46A. At that time, all of the modules are locked in their proper positions.

From the above, it is seen how a non-technical user can completely and easily assemble the different portions of the computer system of the present invention without any tools or implements. Of course, a user can replace any module just as quickly and easily in a similar fashion.

Figure 8:
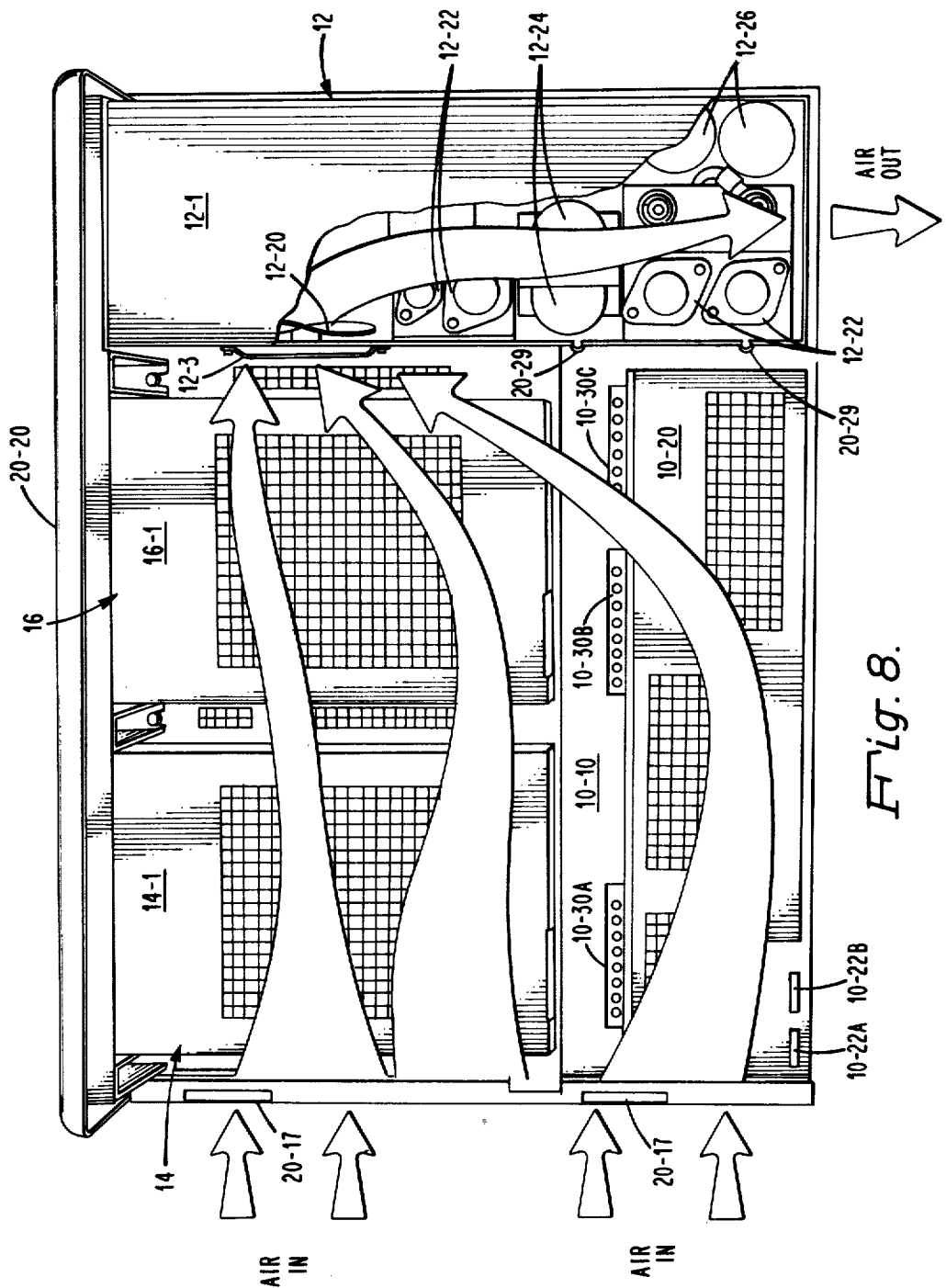
FIG. 8 is a partially sectioned top view of the computer system of FIG. 1.

Now, it will be assumed that the system of FIG. 1 has been assembled and appears as shown in FIG. 9. During operation, the system modules are cooled by the air flow pattern shown in FIG. 8. FIG. 8 shows a top view of modules of the computer system of FIG. 1 loosely assembled within the enclosure 20 with top cover 20-40 removed. A portion of the wrapper 12-1 of module 12 has been cut away to show the arrangement of power supply components which establish the desired flow of air. As shown, the single system fan 12-20 shown in dotted form in FIG. 8 is centrally located on the inner side of power supply module wrapper 12-1 which minimizes acoustic levels.

Considering the flow of air, it is seen from FIG. 8 that air enters through the slots 20-19 of the right side of enclosure base 20-10. The air washes over the tops and through the perforations contained in the wrappers of modules 10, 14 and 16 as shown. Concurrently, the perforations on the bottom, sides and top surfaces of the metal wrappers of modules 14 and 16 allow hot air to be pulled out from the sides and tops of these modules and replaced by cool air. In a similar fashion, cool air passes through the perforations on the bottom sides and top surfaces of enclosure base 20-10 and top section 10-20 of base logic module 10, thereby cooling the circuit chips and components mounted on horizontal circuit board 10-40 and option boards included therein.

As seen from FIG. 8, the air is pulled into power supply module 12 by fan 12-20 and thereafter the action of the fan is reversed. That is, it pushes air across the DC components including power transistors 12-22, transformers 12-24 and capacitive elements 12-26, cooling the power supply components. The hot air is exhausted out the perforations 12-5 located in the rear wall of the power supply module wrapper and through the slots 20-15 of top cover 20-40. The power supply components break up the flow of air without obstructing the air flow pattern so that the air gently exits through top cover 20-40.

In accordance with the present invention, the perforation openings are square-shaped and have a width of at least 0.2 inches. The patterns and hole dimensions of the module wrapper perforations are selected to maximize cooling while at the same time minimizing RFI and EMI interference.

According to the invention, only the bottom and the side of enclosure base 20-10 opposite the fan is slotted as shown in FIG. 9, and the power supply wrapper 12-1 has perforations only at the rear wall or housing. This establishes the desired air flow pattern for maximizing system cooling.

The above has shown a preferred embodiment of a modular computer system constructed to be easily assembled and disassembled by a non-technical user. The modular arrangement permits a user to install and replace modules without tools or implements so as not to cause damage to module parts or components. Additionally, the arrangement enhances module connectability, so that all cable connections and connectors are easily made internally within the system. Further, the module and enclosure assemblies are constructed to establish the side-to-side air flow pattern which maximizes cooling.

It will be obvious to those skilled in the art that many changes may be made to the embodiment of FIG. 1. For example, the teachings of the present invention may be utilized with other types of modules. The module wrappers or containers may be constructed using a smaller number of sections. For example, it is possible to construct a single piece wrapper in which certain modules (e.g. storage modules) can be fitted. Also, the shapes of the wrappers may be appropriately altered as required.

While a desk top version of the computer system has been shown and described, the principles of the present invention may be used in other versions of computer systems, such as in floor units wherein certain modules are differently oriented. For example, the horizontally oriented basic logic module is designed to operate when vertically oriented.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A computer system comprising:
   a plurality of electronically operated modules corresponding to the basic subsystems of said system which are capable of being assembled by a nontechnical user within an enclosure assembly to form said system, each of said modules including the components of one of said subsystems and a wrapper shaped for completely enclosing a physical configuration of subsystem components of said one subsystem to permit damage-free handling of each of said modules by said user, and
   said enclosure assembly including:
   a horizontal base and a bezel joined together to form the front, bottom and sides of said enclosure, said base including a top portion having a plurality of open compartments into which said user can loosely place similarly shaped ones of said modules during system assembly and said bezel having a plurality of openings for framing and restraining certain ones of said modules placeable into different ones of said base compartments by said user; and
   a top cover having top, back and side portions shaped to fit over said base and bezel to completely enclose said modules, said cover being embossed inside to provide a plurality of protrusions, said protrusions being located and shaped so as to properly position each of said modules within said enclosure during the closing of said cover and for holding said modules in place when said cover is latched to said base.

2. The computer system of claim 1 wherein one of said modules is a basic logic board module, said module including a horizontally positioned printed circuit board containing the integrated circuit chip components for a major portion of said computer system and a plurality of vertically positioned printed circuit boards pluggable into a plurality of receptacles on said horizontally positioned board, said basic logic board module wrapper having an L shape for completely enclosing said horizontally and vertically positioned boards, and one of said open compartments of said base being located below said base top portion opening at the back of said enclosure for slidably positioning said basic logic board module within said one compartment from said back of said enclosure.

3. The system of claim 2 wherein said basic logic board wrapper consists of an L-shaped top section and a horizontal bottom section, each of said sections having a plurality of side walls and wherein said module further includes a number of sets of having strips slotted to fit over the edges of mating portions of corresponding walls of said sections, the interior sides of said strips of each set being extruded so as to form flange portions, said flange portions when engaged forming a slot of a predetermined width internal to said sections for engaging and supporting said horizontally positioned circuit board.

4. The system of claim 3 wherein said horizontally positioned printed circuit board has a boarder along the edges of both sides which is free of components for enabling the proper engagement of said board in said slot.

5. The system of claim 3 wherein said module further includes a plurality of receptacles mounted along one side of said horizontally positioned printed circuit board and said top section of said wrapper including a corresponding number of openings on the same side for accessing said receptacles for connecting a corresponding number of external cables.

6. The system of claim 5 wherein said top section further includes a pair of posts positioned adjacent one another at one corner at the rear of said section, said pair of posts forming a cable guide for concentrating said external cables connected to said receptacles in one area so as to facilitate placement and removal of said top cover.

7. The system of claim 3 wherein said top and bottom sections of said basic logic board wrapper contain patterns of perforations for maximizing air flow therethrough.

8. The system of claim 7 wherein said wrapper is made of material and each of said perforations is substantially square in shape providing an open area which maximizes said air flow as well as minimizes the effects of electromagnetic and radio frequency interference.

9. The computer system of claim 1 wherein one of said plurality of wrapped modules is a power module containing a plurality of power supply components physically configured to provide power and cooling for said system, said power module having a substantially rectangular shaped wrapper for housing said power supply components and said power module being positionable by said user into one of said open compartments of said base portion adjacent a predetermined side of said enclosure, said one open compartment being rectangularly shaped for containing said power module and framable within one of said plurality of bezel openings, one of said power supply components comprising a fan positioned at a predetermined location within said power module wrapper for establishing a predetermined air flow pattern for minimizing acoustic levels and minimizing the cooling of said modules during computer system operation when said number of modules have been assembled and locked into place by said cover.

10. The system of claim 9 wherein said fan is mounted on an inside wall of said power module wrapper and wherein only one of said sides of said enclosure opposite said fan contains a plurality of slots, said fan being operative during system operation to pull air through said slots, across the remaining modules, through said power module and through said cover establishing said predetermined air flow pattern.

11. The system of claim 10 wherein only a back wall of said power module wrapper contains perforations, said perforations covering the major portion of said back wall of said wrapper for enabling said fan to push air across a number of said power module components and out through said back wall perforations.

12. The system of claim 10 wherein an inside back portion of said top cover includes a plurality of vertical slots for passing said air through said top cover.

13. The system of claim 12 wherein said inside back portion of said top cover further includes an L-shaped resilient pad positioned to boarder said vertical slots for closing off any recirculation of said air back into said system as it passes through said power module and said top cover.

14. The system of claim 10 wherein said fan is longitudinally centrally located on said inside wall of said power module so as to minimize said acoustic levels, said number of power supply components being physically configured so as to break up said air flow without obstruction for providing a gentle flow of said air through said top cover slots.

15. The system of claim 9 wherein the inside side wall of said power module open compartment contains a plurality of protuberances positioned for spacially separating said wrapper of said power module from said wrapper of another one of said modules located adjacent to said power module compartment thereby facilitating the flow of air through said wrapper of said another one of said modules.

16. The system of claim 15 wherein said other one of said modules is a basic logic board module containing the integrated circuit chip components for a major portion of said computer system, said basic logic board module having a wrapper containing a predetermined pattern of perforations on the top and bottom portions of said wrapper for maximizing the cooling of said integrated circuit chip components.

17. The computer system of claim 1 wherein each one of a number of said plurality of modules is a storage module containing the electrical and mechanical components of a magnetic storage device, said storage module having a wrapper substantially square in shape completely enclosing said storage device and said base top portion having said number of open compartments each being shaped to support and facilitate the cooling of a different one of said number of modules.

18. The computer system of claim 17 wherein said base top portion includes a horizontal member positioned at the rear of said top portion for supporting and preventing the longitudinal mispositioning of said storage modules within said enclosure top portion.

19. The computer system of claim 18 wherein the sides boardering each of said number of open compartments on said base top portion for containing said storage modules have flanges for guiding each of storage modules relative to one of said number of said plurality of openings in said bezel and for laterally restraining the movement of said module on said top portion of said base.

20. The computer system of claim 19 wherein each of the sides of said one of said number of openings in said bezel includes a rib section which fastens to said base top portion, each rib section being notched along a front edge for restraining and properly positioning one of said number of storage modules.

21. The computer system of claim 20 wherein each of the sides of said rib sections boardering each one of said number of openings has a protuberance which extends in a horizontal direction, said protuberance having a predetermined thickness and shape for securely positioning one of said number of storage modules within said one of said number of openings.

22. The computer system of claim 19 wherein the inside edge of the top and sides of said bezel has a raised lip for properly engaging a front portion of said top cover.

23. The computer system of claim 17 wherein an inside portion of the top of said bezel includes a number of sets of tabs, each set being positioned near the center of one of said number of openings, said tabs of each set being angled so as to vertically restrain movement of one of said number of storage modules.

24. The computer system of claim 19 wherein certain ones of said sides behind each rib section are widened to provide additional support for said number of storage modules.

25. The computer system of claim 24 wherein said sides contain perforations for maximizing cooling of said number of storage modules.

26. The computer system of claim 1 wherein said plurality of said modules include a number of storage modules which are positionable on said top portion by said user from the rear of said enclosure base and bezel within a corresponding number of said open compartments and framable within said number of said plurality of bezel openings, said plurality of protrusions including a pair of finger-like protrusions located at predetermined points on said inside of a top portion of said top cover, each of said protrusions having a vertical and horizontal sections molded to form a predetermined angle, said number of storage modules when placed within said open compartments being properly positioned by forces applied thereto by said pair of protrusions during said closing of said cover.

27. The computer system of claim 26 wherein said predetermined angle approximates 90 degrees, said pair of protrusions applying said forces in downward and forward directions for properly positioning said number of storage modules.

28. The computer system of claim 1 wherein said number of said modules in an L-shaped basic logic module, said module being slidably positionable from the back of said enclosure by a user within one of said open compartments located below said base top portion, said plurality of protrusions including a number of ribs laterally locatecd at predetermined points on the inside back portion of said top cover, a top portion of said L-shaped module when placed in said one compartment being laterally positioned within said enclosures by forces applied thereto by said number of ribs during the closing of said top cover.

29. The computer system of claim 28 wherein said top cover further includes a plurality of rectangular shaped resilient pads laterally located at predetermined points on the inside top portion of said top cover, said basic logic module being held in proper position by forces exerted thereon by said pads when said top cover is locked in place.

30. The computer system of claim 1 wherein each side of said top cover is shaped to include a pair of tabs on the bottom and wherein a top portion of each side of said enclosure base contains a pair of slots positioned for receiving a corresponding pair of said top cover tabs, a first one of each pair of tabs being shaped for enabling the correct positioning of said top cover and said modules within said enclosure and a second one of each pair of tabs shaped for holding said top cover in the proper horizontal position relative to said enclosure base.

31. The computer system of claim 30 wherein said top cover further includes a latch assembly, said assembly having a handle coupled to one end of a latch spring and said bottom of said enclosure base including a pair of slots located at predetermined points at the rear of said enclosure bottom, said handle when pressed enabling the other end of said latch spring to pass through and engage said pair of slots, said top cover being locked in place upon release of said handle.

32. The system of claim 31 wherein a top portion of said top cover is recessed to provide an area for the placement of a cathode ray tube display device.

33. The system of claim 32 wherein said plurality of protrusions includes a pair of horizontal rib members integrally molded on said cover, said pair of horizontal rib members positioned so as to provide sufficient support for said display device.

34. A computer system comprising:
 a plurality of customer replaceable modules, each of said modules including a plurality of components having a physical configuration and a wrapper shaped to said physical configuration for completely enclosing said module components for enabling removal damage-free of said each module; and,
 an enclosure including:
  a base and bezel joined together to form the front, bottom and sides of said enclosure, said base including a top section having a plurality of open compartments for loosely containing said plurality of modules and said bezel having a plurality of openings for framing and restraining those modules made accessible to said user during system operation, and
  a top cover having top, back and sides which completely enclose said modules within an area defined by base and bezel, the inside of said top cover being embossed to provide a plurality of protuberances at predetermined locations so as to hold said modules in place during system operation.

35. The system of claim 34 wherein one of said plurality of modules includes a plurality of circuit boards containing a number of integrated circuit chip components for a major portion of said computer system, said circuit boards having a substantially L-shaped physical configuration and an L-shaped wrapper for completely enclosing said module components and said module being slidably removable by a non-technical user from the rear of a first one of said open compartments of said base extending below said top section and being opened at the back in the absence of said top cover.

36. The system of claim 35 wherein another one of said plurality of modules is a power module which includes a plurality of components physically configured to provide power and cooling for said system, said power module having a substantially rectangular shaped wrapper for housing said components and said power module being removable from another one of said open compartments rectangular in shape located adjacent to one side of said enclosure when said second module is lifted out of said compartment by said non-technical user.

37. The system of claim 35 wherein a number of said plurality of modules includes a number of storage modules, each containing the electrical and mechanical components of a magnetic storage device having a substantially square physical configuration and each having a substantially square shaped wrapper completely enclosing said device, said number of storage modules being removable from said top portion of said base when lifted up from said top portion by said non-technical user.

38. A computer system comprising:
 a plurality of electronically operated modules, one of which is a power module, each of said modules including a number of components which made up one of a plurality of subsystems of said system and a container wrapper completely enclosing said module components for enabling damage-free replacement of said module associated therewith; and
 an enclosure having a base and bezel coupled together to form the front, bottom and sides of said enclosure and a top cover shaped to fit over said base and bezel and completely enclose said modules, said base portion including a top portion having a plurality of open compartments which loosely hold said modules in place and said power module containing a plurality of components physically configurated to provide power and cooling for said system, said power module being located in one of said open compartments of said base portion adjacent to a predetermined side of said enclosure and the other side of said enclosure including a plurality of equally spaced slots, said plurality of components including a fan positioned at a predetermined location within said power module wrapper selected for establishing a predetermined flow of air from said slots across the remaining modules and through said power module.

39. The system of claim 38 wherein the wrappers of said remaining module and portions of said base top portion contain perforations distributed over the major portions of their surfaces so as to maximize the cooling effect of said predetermined flow of air established by said power module fan.

40. The system of claim 39 wherein only a major portion of the back of said power module wrapper contains perforations enabling said fan to push said predetermined flow of air across a major portion of said power module components and out through said perforations on said back of said powder module wrapper.

41. The system of claim 40 wherein said predetermined flow of air moves side to side across said remaining modules and wherein said fan is longitudinally centrally located on said inside wall of said power module so as to minimize acoustic levels, said major portion of said power module components being physically configured so as to break up said flow of air without obstruction for providing a gentle flow of air through said back perforations.

42. A computer system comprising:
 a plurality of wrapped electronically operated modules one of which is a basic logic board module, said basic logic module at least one including a circuit board containing integrated circuit chip components for a major portion of said system and a two section wrapper shaped for completely enclosing said circuit board; and,
 an enclosure including a plurality of open compartments for loosely containing said plurality of wrapped modules, said logic board wrapper consisting of a top section and a bottom section, each of said sections having a plurality of side walls and said logic board module further including a number of sets of flexible strips slotted at the top to fit over the edges of corresponding walls of said sections, the interior sides of said strips of each set being extruded so as to form flanges, said flanges forming said slot of a predetermined width internal to said sections for clamping and supporting said printed circuit board.

43. The system of claim 42 wherein said top and bottom sections and printed circuit board contain a plurality of holes at predetermined points and wherein said logic module includes a corresponding number of bushings for fastening said circuit board between said top and bottom wrapper sections.

44. The system of claim 43 wherein said printed circuit board has a boarder along the edges of both sides which is free of components for proper engagement of said board within said slot.

45. The system of claim 43 wherein said module further includes a plurality of receptacles mounted along one side of said printed circuit board and said top section of said wrapper includes a corresponding number of openings on the same side for accessing said receptacles for connection of a corresponding number of external cables.

46. The system of claim 45 wherein said top section further includes a pair of posts positioned adjacent one another at one corner near the back edge of said section for concentrating said external cables connected to said receptacles in one area so as to facilitate placement and removal of said top cover.

47. The system of claim 43 wherein said top and bottom sections of said basic logic board wrapper contain patterns of perforations for maximizing air flow therethrough.

48. The system of claim 47 wherein said top and bottom sections are constructed of metal material and wherein each of said perforations is square in shape with an area to maximize said air flow as well as minimize the effects of electromagnetic and radio frequency interference.

49. A method of constructing a computer system having a plurality of basic subsystems for assembly and disassembly by a non-technical user without requiring tools or other implements, said method comprising:

transforming said plurality of basic subsystems into a plurality of modules, each module including all of the components of one basic system;

constructing a plurality of container wrappers, each shaped to have a physical configuration which completely encloses all of the components of a different one of said plurality of modules within a minimum of space and permits damage-free assembly and error-free replacement of said modules by said user; and, constructing an enclosure assembly including a base with plurality open compartments into which said plurality of modules can be easily placed into or removed from by said user and a top cover shaped and embossed to fit over said base and completely enclose and hold said modules within the areas established by said open compartments and said embossed cover.

* * * * *